US005703528A

United States Patent [19]
Nebuloni et al.

[11] Patent Number: 5,703,528
[45] Date of Patent: Dec. 30, 1997

[54] AUDIO AMPLIFIER TURN-OFF CONTROL CIRCUIT

[75] Inventors: Daniela Nebuloni, Bareggio; Andrea Fassina, Milan, both of Italy

[73] Assignee: SGS-Thomson Microelectronics S.r.L., Agrate Brianza, Italy

[21] Appl. No.: 337,108

[22] Filed: Nov. 10, 1994

Related U.S. Application Data

[63] Continuation of Ser. No. 65,672, May 21, 1993, Pat. No. 5,420,535.

[51] Int. Cl.[6] .................. H03F 1/14; H04B 15/00; H03B 21/00
[52] U.S. Cl. .................. 330/51; 381/94; 381/120
[58] Field of Search .................. 330/51, 297, 194; 381/120, 121, 94, 110

[56] References Cited

U.S. PATENT DOCUMENTS

| | | | |
|---|---|---|---|
| 3,840,820 | 10/1974 | Kawada | 330/207 |
| 3,992,677 | 11/1976 | Tsurushima | 330/149 |
| 4,112,385 | 9/1978 | Kusumi | 330/149 |
| 4,181,895 | 1/1980 | Yoshida | 330/279 |
| 4,315,221 | 2/1982 | Numata et al. | 330/51 |
| 4,371,841 | 2/1983 | Eckert et al. | 330/51 |
| 4,390,847 | 6/1983 | Yamada et al. | 330/51 |
| 4,788,508 | 11/1988 | Kawai | 330/51 |
| 5,059,919 | 10/1991 | Kinoshita | 330/51 |
| 5,199,079 | 3/1993 | Anderson et al. | 381/94 |
| 5,255,094 | 10/1993 | Yong et al. | 358/165 |
| 5,307,025 | 4/1994 | Colvin et al. | 330/149 |
| 5,414,386 | 5/1995 | Adachi et al. | 381/94 |
| 5,420,535 | 5/1995 | Nebuloni | 330/51 |

FOREIGN PATENT DOCUMENTS

| | | |
|---|---|---|
| 0 069 843 | 1/1983 | European Pat. Off. |
| 0 281 117 | 9/1988 | European Pat. Off. |
| 0 368 528 | 5/1990 | European Pat. Off. |
| 59-230306 | 12/1984 | Japan . |
| 60-123111 | 7/1985 | Japan . |

*Primary Examiner*—William L. Sikes
*Assistant Examiner*—Tiep H. Nguyen
*Attorney, Agent, or Firm*—David V. Carlson; Michael J. Donohue; Seed and Berry LLP

[57] ABSTRACT

A circuit comprising a transistor which, when supply is turned off, locks the output of the audio amplifier to the supply line, the potential of which is reduced gradually by a filter capacitor, so that the output voltage follows the supply voltage with the same slope, and is so controlled by the filter capacitor, thus eliminating undesired noise ("popping") at the output caused by electric transients in the audio amplifier.

15 Claims, 2 Drawing Sheets

AUDIO AMPLIFIER TURN-OFF CONTROL CIRCUIT

CROSS REFERENCE TO RELATED APPLICATION

This application is a continuation of U.S. patent application Ser. No. 08/065,672, filed May 21, 1993, now U.S. Pat. No. 5,420,535.

TECHNICAL FIELD

The present invention relates to a circuit for turn-off control of audio amplifiers, in particular, single-ended, single-feed types.

BACKGROUND OF THE INVENTION

All audio amplifiers present a noise filtering capacitor between the supply line and ground. Due to the widely varying frequency and peak value of the noise at the supply, the filter capacitor presents a fairly high value, whereas the equivalent resistance of the overall amplifier circuit is small, thus resulting in a small discharge constant and in fairly fast discharge of the capacitor itself.

When the audio amplifier is turned off, i.e., when the power supply is cut off, various high-speed electric transients therefore occur, resulting in poorly controlled variations in the amplifier output and in an annoying "popping" noise on the loudspeakers driven by the amplifier.

SUMMARY OF THE INVENTION

It is an object of the present invention to provide a circuit designed to eliminate the above noise by guaranteeing a controlled transient output voltage of the audio amplifier when this is turned off.

According to the present invention, there is provided a voltage sensing circuit coupled to the supply voltage and generating a control signal if the supply voltage drops below a predetermined threshold. A control element operatively receives the control signal and causes a reduction in the output signal that corresponds to the decrease in the supply voltage.

In one embodiment, a switch element controlled by the voltage sensing circuit couples the output to the control elements. The control element is activated only when the switch element first couples the output to the control element followed by a second control signal output dropping below a second threshold.

The present invention thus provides for a circuit which, when the power supply is cut off, locks the output to the supply line, the potential of which is gradually reduced by virtue of the filter capacitor, so that the output follows the supply line, with the same slope, and is thus controlled by the filter capacitor.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
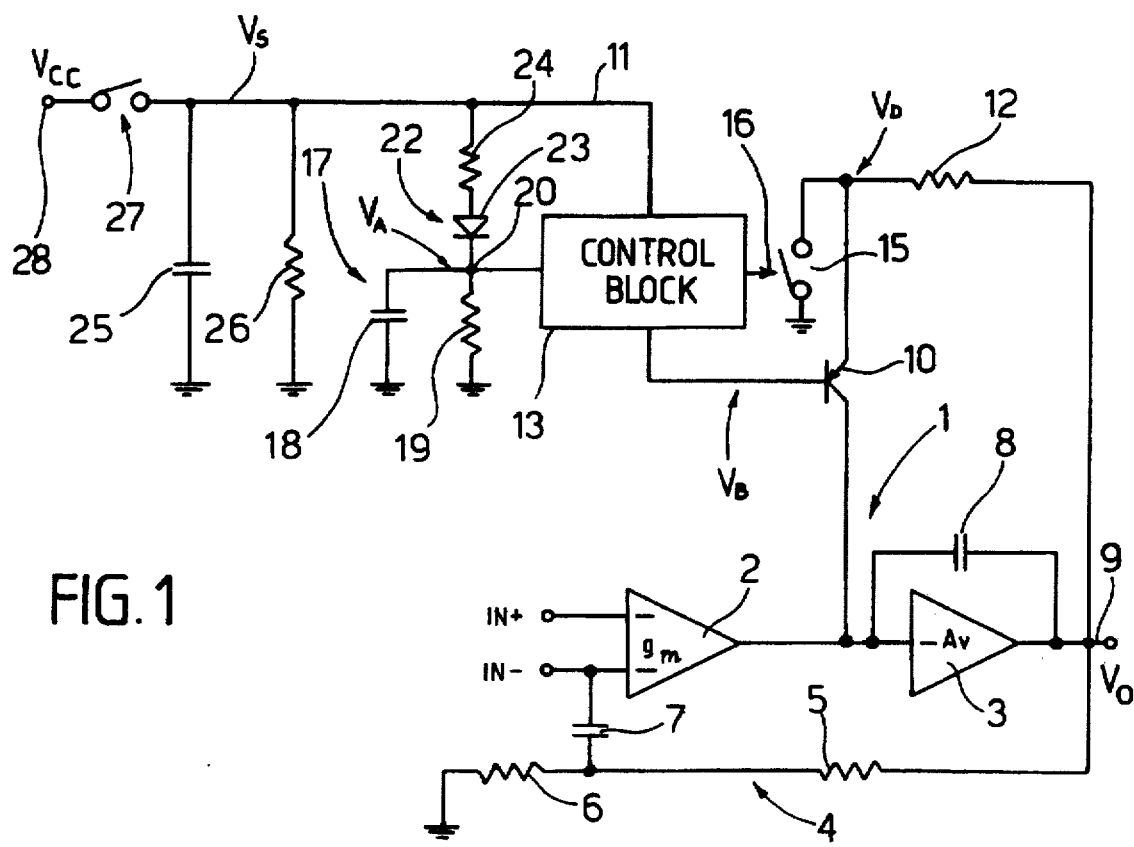
FIG. 1 shows a block diagram of the circuit according to the present invention.

In FIG. 1, the audio amplifier, indicated as a whole by 1, is represented by the cascade connection of two stages, more specifically, an input stage 2 having a high transconductance $g_m$, and a gain stage 3 with gain $-A_v$. The positive input IN+ of input stage 2 is supplied in known manner with the audio signal, while the negative input IN− is connected to an output 9 of audio amplifier 1 via a feedback network 4 including a pair of resistors 5, 6 connected between the output 9 and ground, and a capacitor 7 connected between the midpoint of resistors 5, 6 and negative input IN−. A compensating capacitor 8 is provided between the input and output of gain stage 3. The input stage 2 and gain stage 3 are any of many known circuits and are operated on the power of a supply voltage $V_S$, the details of which are not shown because it is well-known in the art.

According to principles of the present invention, as shown in FIG. 1, a PNP type transistor 10 is provided for locking output 9 of audio amplifier 1 and supply line 11. More specifically, transistor 10 presents the collector connected to the input of gain stage 3, the emitter connected to output 9 via the interposition of a high-value resistor 12, and the base connected to the output of a control block 13 for generating a potential $V_B$ in relation to ground. The emitter of transistor 10, at which potential $V_D$ is present, is also groundable by a switch 15 having a control terminal 16 also controlled by control block 13.

Control block 13 is in turn connected to supply line 11, set to potential $V_S$ in relation to ground, and to a voltage source 17 for generating a lower potential $V_A$ in relation to ground as compared with steady-state supply voltage $V_{CC}$. More specifically, voltage source 17 comprises a capacitor 18 and a resistor 19 parallel-connected between a node 20 and ground, node 20 being connected to supply line 11 via a branch 22 formed by the series connection of at least one diode 23 and a resistor 24 (but possibly comprising a number of diodes and resistors).

The FIG. 1 circuit is completed by a filter capacitor 25 for filtering noise on supply line 11 and located between line 11 and ground; a resistor 26 representing the equivalent resistance of audio amplifier 1 as seen by filter capacitor 25 and in which filter capacitor 25 discharges when the power supply is cut off; and a switch 27 between supply line 11 and input 28 at which the voltage $V_{CC}$ supplied by an external power supply unit (not shown) is present.

In the FIG. 1 circuit, the time constant of the filter formed by components 25, 26 is smaller than that of voltage source 17 formed by components 18, 19, so that capacitor 25 discharges faster than capacitor 18, the voltage of which may thus be assumed more or less constant as regards the circuit according to the present invention.

When activated, transistor 10, by which the output of audio amplifier i is locked to supply line 11, thus provides for local feedback between the amplifier output 9 and the input of the gain stage 3.

The transistor 10 and gain stage 3 structure may be represented schematically by an equivalent operational amplifier having a positive input corresponding to the base terminal of transistor 10, a negative input corresponding to the emitter of transistor 10 (with switch 15 open), and an output corresponding to output 9 of audio amplifier 1; and which, despite being closed in unit-gain manner by resistor 12, is stable.

The stability of the equivalent operational amplifier is explainable by comparing it with audio amplifier 1. Both present gain stage 3 with compensating capacitor 8, whereas input stage 2 of audio amplifier 1 presents a high transconductance, the transconductance of the equivalent operational amplifier equals the inverse of the resistance of resistor 12 ($1/R_g$, where $R_g$ is the resistance of resistor 12) which, by appropriately selecting $R_g$, is much lower than $g_m$. As a result, the loop gain of the operational amplifier is sufficiently lower as compared with audio amplifier 1 to achieve a lower closed-loop gain for a given degree of stability.

Figure 2:
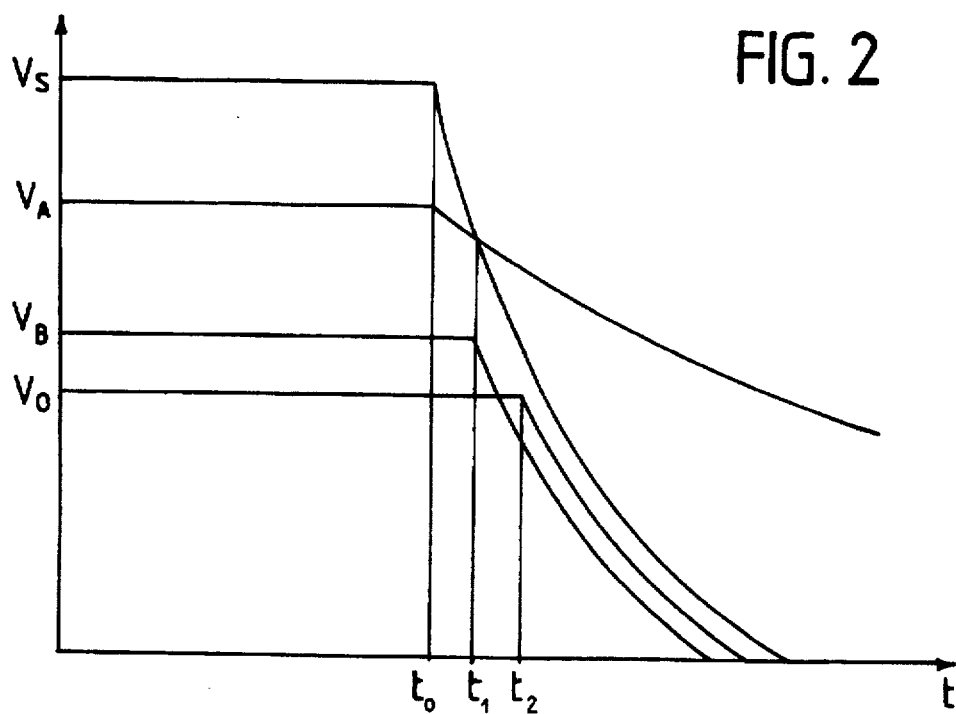
FIG. 2 shows a time graph of a number of electric quantities (not to scale) in FIG. 1.

Operation of the FIG. 1 circuit will be described with reference also to FIG. 2. Under normal operating conditions, voltage $V_S$ over supply line 11 presents steady-state value $V_{CC}$ (switch 27 closed); audio amplifier 1 is active; output voltage $V_o$ at output 9 presents the steady-state value; filter capacitor 25 is charged to $V_{CC}$; and capacitor 18 to $V_A$. Control block 13 therefore maintains switch 15 closed, and supplies the base of transistor 10 with a positive potential $V_B$ in relation to ground, so that the emitter of transistor 10 is grounded; transistor 10 is off; and high-value resistor 12 has no effect on output potential. This is the state of the circuit over the long term operation with the audio amplifier on.

The turn-off phase commences when switch 27 is opened (instant $t_o$), at which point filter capacitor 25 discharges rapidly into resistor 26, thus causing a corresponding reduction in $V_S$; and, at the same time, voltage $V_A$ at point 20 is reduced by virtue of capacitor 18 discharging into resistor 19, but at a slower rate than filter capacitor 25.

Upon $V_S$ falling below $V_A$ (instant $t_1$), control block 13 switches and emits a signal for opening switch 15; switch 15 opens so that the emitter of transistor 10 is no longer grounded; and the emitter voltage $V_D$ substantially switches to potential $V_o$ of output 9 of audio amplifier 1. Control block 13 also modifies the value of potential $V_B$ so that it tracks voltage $V_S$, as provided on supply line 11. Potential $V_B$ thus begins to fall, tracking $V_S$ but staying below $V_S$ but, because $V_B > V_D - V_{BE}$ (where $V_{BE}$ is the base-emitter voltage drop of transistor 10, and, at this phase, $V_D \cong V_o$) still applies, transistor 10 remains off.

Upon $V_B$ falling below $V_D - V_{BE}$ (instant $t_2$), transistor 10 comes on and locks output 9 to voltage $V_B$ at its base and, consequently, to supply voltage $V_S$, so that output 9 is grounded in controlled manner by the discharging of filter capacitor 25.

Figure 3:
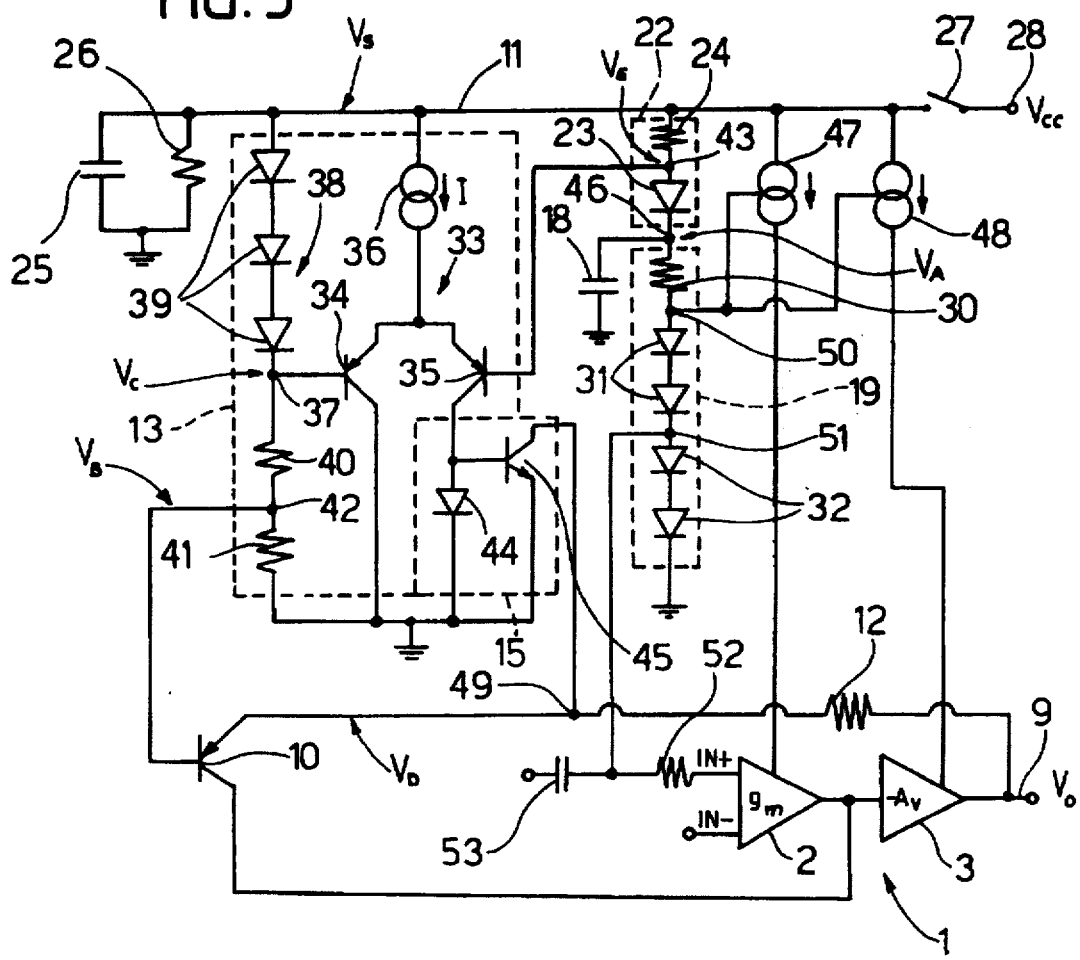
FIG. 3 shows a circuit diagram of the circuit according to the present invention.

FIG. 3 shows a circuit embodiment, by way of example, of the FIG. 1 blocks, in which can be seen input stage 2 and gain stage 3 of audio amplifier 1; filter capacitor 25 and capacitor 18; resistors 12 and 26; supply line 11; switch 27; transistor 10; and branch 22 including diode 23 and resistor 24. In the example shown, resistor 19 is formed by the series connection of a resistor 30 (connected to capacitor 18 at node 46) and two pairs of diodes 31, 32; and control block 13 comprises a differential stage 33 formed by two PNP type transistors 34, 35 having the emitters connected to each other and to a current source 36 also connected to supply line 11. The base of transistor 35 is connected to node 43 between resistor 24 and the anode of diode 23 (set to potential $V_E$), while the base of transistor 34 is connected to node 37 of a branch 38 formed by three diodes 39 series-connected between supply line 11 and node 37 (with the cathode facing node 37), and by two series-connected resistors R1 and R2, labeled 40, 41, respectively, between node 37 and ground. Node 42 between resistors 40, 41 is connected to the base of transistor 10; the collector of transistor 34 is grounded; the collector of transistor 35 is connected to the anode of a diode 44 having its cathode grounded and which, together with an NPN type transistor 45, forms switch 15; and transistor 45 presents its base connected to the anode of diode 44, its emitter grounded, and its collector connected to the emitter of transistor 10 at node 49.

FIG. 3 also shows, schematically, current sources 47 and 48, respectively, relative to input stage 2 and gain stage 3, and controlled by the potential at node 50 between resistor 30 and the series connection of diodes 31, 32. Feedback network 4 and compensating capacitor 8 (connected as in FIG. 1) are not shown in FIG. 3 circuit, which shows the connection, via a resistor 52, of positive input IN+ of input stage 2 is supplied with the audio signal via a decoupling capacitor 53.

The FIG. 3 circuit operates as follows.

Under normal operating conditions and in the absence of an audio signal, the value of output 9 of audio amplifier 1 is determined by the bias network (not shown) and normally equals half supply voltage $V_{CC}$ ($V_o = V_{CC}/2$). Moreover, if $R_1$ and $R_2$ are the respective resistances of resistors 40 and 41; $R_3$ the (same) resistance of resistors 24 and 30; and $V_A$, $V_B$, $V_C$, $V_D$ and $V_E$ the respective potentials of nodes 46, 42, 37, 49, and 43:

$$V_C = V_{CC} - 3 V_{BE}$$

where $V_{BE}$ is the voltage drop of each diode 39; and $$V_B = V_C R_2/(R_1 + R_2)$$
$$V_A = V_{CC} - V_{BE} - R_3(V_{CC} - 5V_{BE})/(2R_3)$$
$$= V_{CC}/2 + 3V_{BE}/2$$
$$V_E + V_{CC}/2 + 5V_{BE}/2$$

Under normal operating conditions, therefore, $V_E < V_C$, so that transistor 35 is on, and current I from current source 36 flows into diode 44 by which it is mirrored to transistor 45. As a result, potential $V_D$ is fairly low, at any rate lower than $V_B + V_{BE}$ so that transistor 10 is off, and, by virtue of the low value of current I, normal operation is unaffected by the circuit.

When switch 27 is opened, thus cutting off supply and gradually reducing voltage $V_S$ controlled by the discharging of filter capacitor 25, the turn-off control circuit is activated according to the following three phases:

1) $V_C > V_E$

Potential $V_C$ dependent on $V_S$ falls gradually initially, however, as long as potential $V_C$ is greater than $V_E$ the circuit remains in the foregoing condition. Potential $V_E$ and consequently $V_A$ also fall in this phase, but, due to the sizing of the components, at a slower rate as compared with $V_S$.

2) $V_C < V_E$ and $V_B > V_D - V_{BE}$

When this applies, transistor 35 is turned off, transistor 34 turned on, and consequently diode 44 and transistor 45 turned off. As the base-emitter voltage drop of transistor 10 prevents it from being turned on, potential $V_D$ follows output voltage $V_o$ of audio amplifier 1.

3) $V_C < V_E$ and $V_B \cong V_D - V_{BE}$

When this applies, transistor 10 comes on so as to ground output 9 (locked to the emitter of transistor 10) according to the fall in potential $V_B$ at the base of the transistor and consequently also in $V_S$.

The advantages of the circuit according to the present invention will be clear from the foregoing description. In particular, it provides for ensuring controlled reduction at all times of the output during turn-off, and so preventing undesired noise (popping) caused by transients occurring in the system.

In the FIG. 3 circuit, overall operation of the amplifier depends on the chain formed by branch 22, and resistor 19, and thus on potentials varying more slowly as compared with supply voltage $V_S$. Dependence of the control circuit on the above chain enables the thresholds to be so calculated as to ground the output 9 while input stage 2 and current sources 47, 48 of audio amplifier 1 are still active, thus maintaining feedback of the output.

The first phase in the operation of the control circuit prevents the circuit from operating under steady-state conditions, in the event of temporary failure or a negligible fall in supply; while the second phase enables the emitter of transistor 10 to reach the output voltage value before voltage $V_B$ falls below the steady-state output voltage value minus $V_{BE}$, thus preventing an undesired step transient and, consequently, popping of the amplifier output when switch 15 is opened.

Current I of current source 36 and resistance 12 may be so calculated that transistor 10 remains off even in the presence of a signal under normal operating conditions, for which purpose, the following must apply:

$$V_C > V_E$$

which undoubtedly applies by virtue of both $V_C$ and $V_E$ presenting a fixed direct current offset and being unaffected by the signal;

$$V_B > (V_D)_{DC} + (V_D)_{AC} - V_{BE}$$

where $(V_D)_{DC}$ and $(V_D)_{AC}$ are, respectively, the direct and alternating current offset of the potential at node 49, so that transistor 10 definitely remains off.

Figure 4:
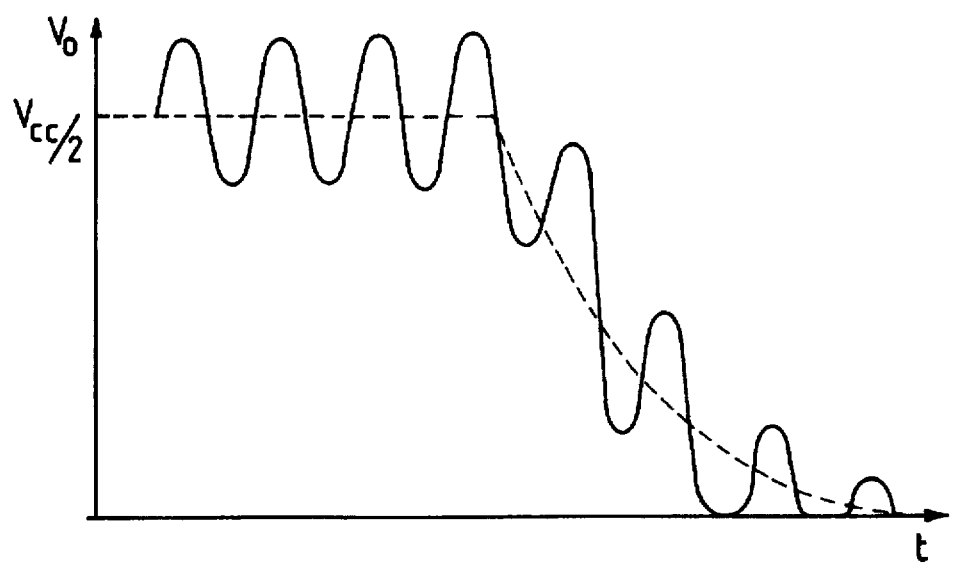
FIG. 4 shows a graph of the amplifier output during turn-off and in the presence of a signal.

When supply is cut off in the presence of a signal, the circuit operates in the same way as described above, except that the value of $V_D$ varies, so that transistor 10 alternates between phases wherein supply is locked and phases of inactivity, depending on the amplitude and frequency of the signal, the mean value of output 9, however, being grounded as shown in FIG. 4.

An important point to note is that, even in the presence of a signal, the control circuit operates while the amplifier is still being fed back, so that the output is nevertheless related to the inputs and the potentials of the chain formed by branch 22 and resistor 19.

The circuit according to the present invention is straightforward in design, reliable, and provides for trouble-free manufacture and integration using current techniques. Moreover, the control circuit employs characteristics of the amplifier that are useful for other and/or existing functions, i.e. timing by the capacitors necessarily provided for in the application, and the references of the chain formed by branch 22 and resistor 19, which may also be employed for normal operation of the audio amplifier.

To those skilled in the art it will be clear that changes may be made to the circuit as described and illustrated herein without, however, departing from the scope of the present invention. In particular, voltage source 17 in FIG. 1 may be implemented differently, either as a unit designed to maintain a constant voltage at its terminals, or a unit whose voltage falls alongside a fall in supply, providing the unit voltage falls more slowly than supply. Finally, though the solution shown, wherein the control feedback loop is located between the input and output of the gain stage only, is preferable in terms of stability, other solutions also including the input stage in the control loop are possible by connecting the feedback element (transistor 10) between the output and input of audio amplifier 1 as a whole.

We claim:

1. A circuit for turn-off control of an audio amplifier supplied by a supply line with a supply voltage, the circuit comprising:

an input terminal for input of an audio signal;

an output terminal with an output voltage;

a first controlled switch element to couple said output terminal to the supply line so as to lock said output voltage to the supply voltage in response to a fall in the supply voltage; and a control stage for controlling said controlled switch wherein said control stage comprises a voltage source generating a reference voltage; and a comparator having a first input coupled to said voltage source, a second input coupled to the supply line, and a comparator output coupled to a terminal for controlling said controlled switch, said comparator output generating a control signal that closes said controlled switch when the supply voltage reaches a predetermined value with respect to said reference voltage.

2. The circuit of claim 1, further including a filter circuit between said supply line and a reference potential line, said filter circuit having a first time constant, said voltage source comprising a capacitive element and a resistive element defining a second time constant greater than said first time constant.

3. The circuit of claim 1, wherein said voltage source is coupled to the supply line via a resistive branch including a voltage-controlled unipolar switch.

4. The circuit of claim 1 wherein said controlled switch comprises a transistor and said comparator comprises a differential circuit having a first input coupled to the supply line, a second input coupled to said voltage source, and an output coupled to a control terminal of a second switch element, said second switch element having a first terminal coupled to a reference potential line, and a second terminal coupled to a first terminal of said transistor, said transistor being coupled by said first terminal to said output terminal of the audio amplifier and by a control terminal to the supply line via resistive elements.

5. A circuit for turn-off control of an audio amplifier supplied by a supply line with a supply voltage, the circuit comprising:

an input terminal for input of an audio signal;

an output terminal with an output voltage;

a first controlled switch element, comprising a transistor, to couple said output terminal to the supply line so as to lock said output voltage to the supply voltage in response to a fall in the supply voltage; and a control stage for controlling said transistor, said transistor having a first terminal connected to said output terminal of the audio amplifier, a second terminal connected to said input terminal of the audio amplifier, and a control terminal connected to said control stage, said first terminal of said transistor also being connected to a reference potential line via a second switch element controlled by said control stage.

6. The circuit of claim 5 wherein said control stage presents a first output coupled to said control terminal of said transistor, and a second output coupled to a control terminal of said second switch element.

7. An amplifier control circuit to control an amplifier when power to the amplifier is turned off, the circuit comprising:

an audio amplifier circuit having an input terminal and an output terminal, said audio amplifier circuit coupled to and receiving power from a supply voltage and providing an output signal at said output terminal;

a voltage sensing circuit coupled to said supply voltage and generating a transient control voltage in response to a decrease in said supply voltage, said voltage sensing circuit outputting a first control output signal and causing a change in said first control output signal when said transient control voltage falls below a first threshold voltage; and a control element coupled to said voltage sensing circuit and to said audio amplifier circuit and receiving said first control output signal, said control element entering an active state after said change in said first control output signal, said control element functioning to couple said amplifier circuit output terminal to said supply voltage to cause a reduction in the amplitude of said audio amplifier circuit output signal in a controlled manner.

8. The circuit of claim 7 wherein said control element is a transistor.

9. The circuit of claim 7 wherein said supply voltage includes a first capacitive element having a first discharge time constant controlling a rate of change of said supply voltage and said voltage sensing circuit includes a second capacitive element having a second discharge time constant controlling a rate of change of said transient control voltage, said first discharge time constant being less than said second discharge time constant.

10. The circuit of claim 7, further including a comparator having first and second comparator inputs and a comparator output coupled to said first control output signal, said first comparator input being configured to receive said supply voltage and said second comparator input being configured to receive said transient control voltage wherein said comparator output changes states when said supply voltage is less than said transient control voltage.

11. The method of claim 10 wherein said voltage sensing circuit prevents activation of said control element until said amplified output signal has been coupled to said control element.

12. A method for turn-off control of an audio amplifier having audio input and output terminals and supplied by a supply voltage, the audio output terminal generating an output signal, the method comprising the steps of:

sensing the supply voltage to detect a decrease in the supply voltage;

coupling the audio output terminal to the supply voltage by controlling a controlled switch so as to lock the output voltage to the supply voltage in response to a fall in the supply voltage;

wherein the step of controlling the controlled switch includes performing the steps of:

generating a reference voltage;

comparing said reference voltage and the supply voltage; and generating a control signal that closes said controlled switch when the supply voltage reaches a predetermined value with respect to said reference voltage.

13. The method of claim 12 wherein said voltage source includes a capacitive element and a resistive element defining a first time constant, the method further including the step of providing a filter circuit between the supply voltage and a reference potential line, said filter circuit having a second time constant less than said first time constant.

14. A circuit for turn-off control of an audio amplifier supplied by a supply line with a supply voltage, the circuit comprising:

an input terminal for input of an audio signal;

an output terminal with an output voltage; and a transistor to couple said output terminal to the supply line so as to lock said output voltage to the supply voltage in the event of a fall in the supply voltage said transistor having a first terminal connected to said output terminal of the audio amplifier, a second terminal connected to said input terminal of the audio amplifier, and a control terminal connected to a control stage for controlling said transistor, said first terminal of said transistor also being connected to a reference potential line via a switch element controlled by said control stage.

15. An amplifier control circuit to control an amplifier when power to the amplifier is turned off, the circuit comprising:

an audio amplifier circuit having an input terminal and an output terminal, said audio amplifier circuit coupled to and receiving power from a supply voltage and providing an output signal at said output terminal;

a voltage sensing circuit coupled to said supply voltage and generating a transient control voltage in response to a decrease in said supply voltage, said voltage sensing circuit outputting a first control output signal and causing a change in said first control output signal when said transient control voltage falls below a first threshold voltage;

a comparator having first and second comparator inputs and a comparator output coupled to said first control output signal, said first comparator input being configured to receive said supply voltage and said second comparator input being configured to receive said transient control voltage wherein said comparator output changes states when said supply voltage is less than said transient control voltage; and a control element coupled to said voltage sensing circuit and to said audio amplifier circuit and receiving said first control output signal, said control element entering an active state after said change in said first control output signal, said control element functioning to couple said amplifier circuit output terminal to said amplifier circuit input terminal to cause a reduction in the amplitude of said audio amplifier circuit output signal in a controlled manner.

* * * * *

UNITED STATES PATENT AND TRADEMARK OFFICE
CERTIFICATE OF CORRECTION

PATENT NO. : 5,703,528
DATED : December 30, 1997
INVENTOR(S) : Nebuloni and Fassina It is certified that error appears in the above-indentified patent and that said Letters Patent is hereby corrected as shown below:

In column 6, claim 4, line 48, delete "dement," and substitute therefor -- element, --.

Signed and Sealed this

Seventh Day of July, 1998

*Attest:*

BRUCE LEHMAN

*Attesting Officer*    Commissioner of Patents and Trademarks